(12) United States Patent
Shen et al.

(10) Patent No.: US 7,888,783 B2
(45) Date of Patent: *Feb. 15, 2011

(54) CHIP PACKAGE STRUCTURE AND THE METHOD THEREOF WITH ADHERING THE CHIPS TO A FRAME AND FORMING UBM LAYERS

(75) Inventors: Geng-Shin Shen, Hsinchu (TW); Yu-Ren Chen, Hsinchu (TW)

(73) Assignees: Chipmos Technologies Inc, Hsinchu (TW); Chipmos Technologies (Bermuda) Ltd, Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,778

(22) Filed: Mar. 2, 2010

(65) Prior Publication Data

US 2010/0155916 A1 Jun. 24, 2010

Related U.S. Application Data

(62) Division of application No. 12/325,303, filed on Dec. 1, 2008, now Pat. No. 7,700,412.

(30) Foreign Application Priority Data

Mar. 20, 2008 (TW) ............................. 97109826 A

(51) Int. Cl.
*H01L 21/44* (2006.01)
*H01L 21/302* (2006.01)
*H01L 21/461* (2006.01)
*H01L 21/31* (2006.01)
*H01L 21/469* (2006.01)

(52) U.S. Cl. .................. 257/676; 257/690; 257/778
(58) Field of Classification Search ................ 257/676, 257/690, 778, E21.502, E23.031
See application file for complete search history.

(56) References Cited

U.S. PATENT DOCUMENTS

2005/0124093 A1 * 6/2005 Yang et al. .................. 438/110
2009/0230527 A1 * 9/2009 Shen .......................... 257/676

* cited by examiner

*Primary Examiner*—William M. Brewster
(74) *Attorney, Agent, or Firm*—Ming Chow; Sinorica, LLC

(57) ABSTRACT

A chip package structure includes a chip-placed frame that having an adhesive layer thereon; a chip includes a plurality of pads on an active surface thereon, and is provided on the adhesive layer; a package structure is covered around the four sides of the chip-placed frame, and the height of the package structure is larger than the height of the chips; a plurality of patterned metal traces is electrically connected to the plurality of pads, another end is extended out to cover the surface of the package structure; a patterned protective layer is covered on the patterned metal traces and another end of the patterned metal traces is exposed; a plurality of patterned UBM layer is formed on the extended surface of the patterned metal traces; and a plurality of conductive elements is formed on the patterned UBM layer and is electrically connected to one end of the exposed portion of the patterned metal traces.

5 Claims, 12 Drawing Sheets

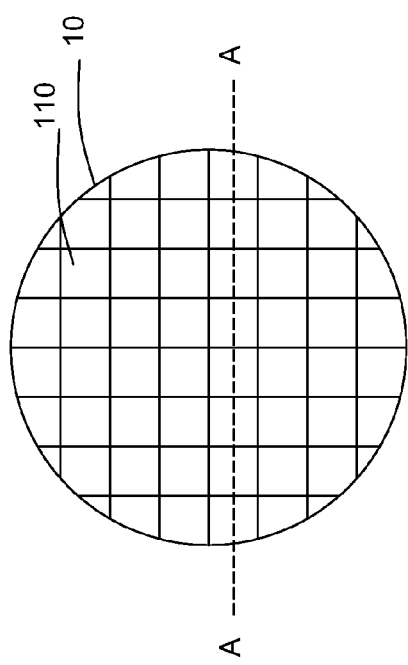
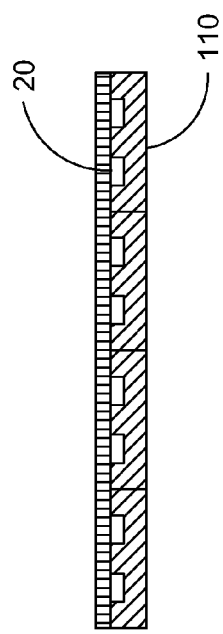

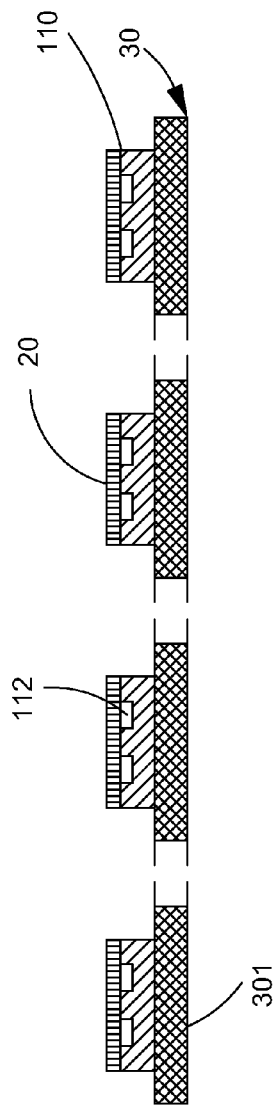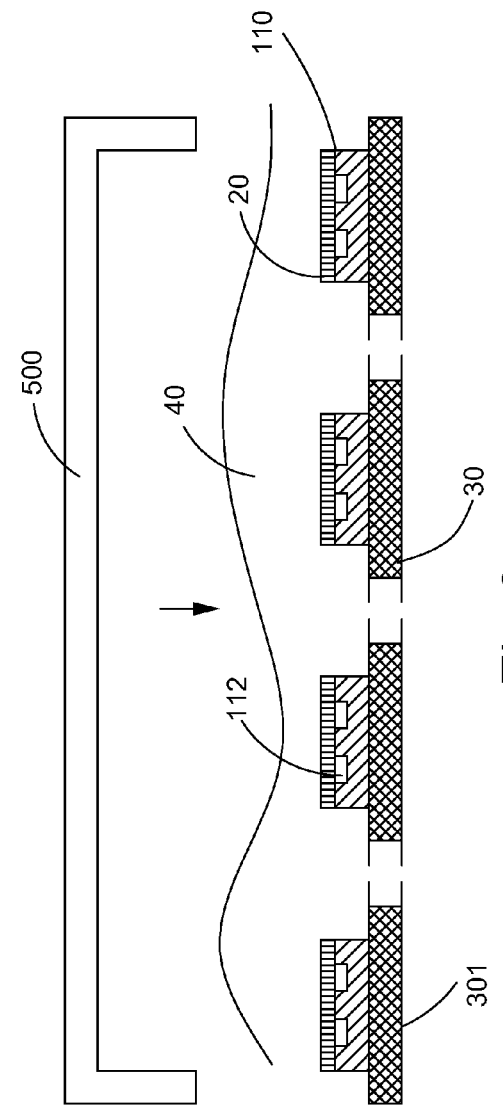

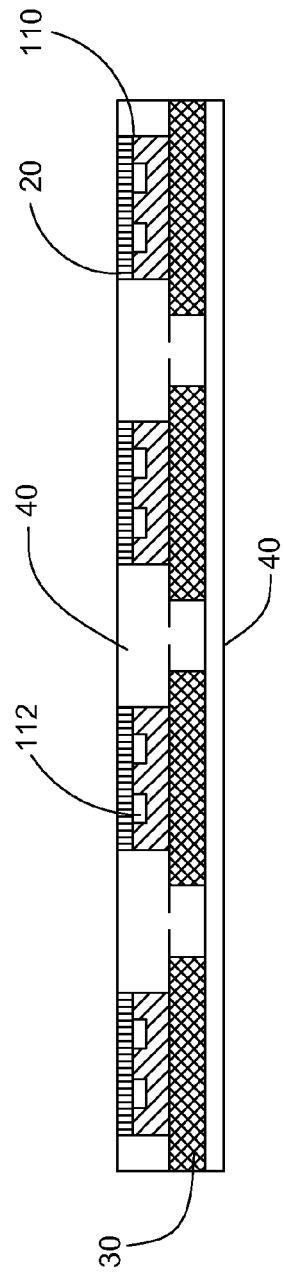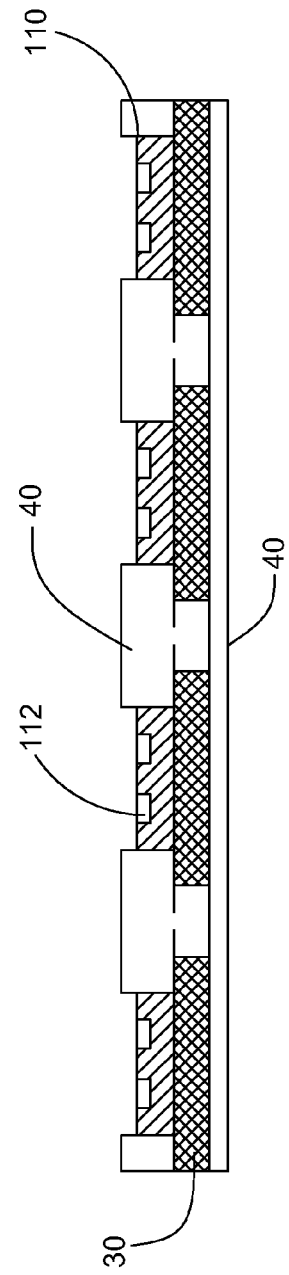

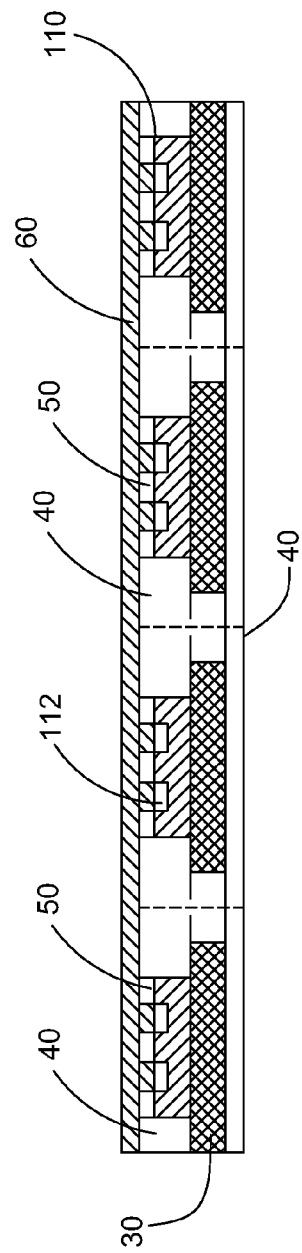
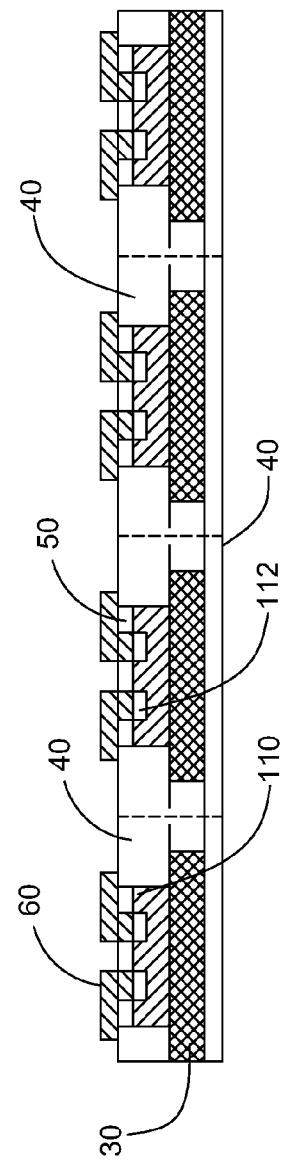

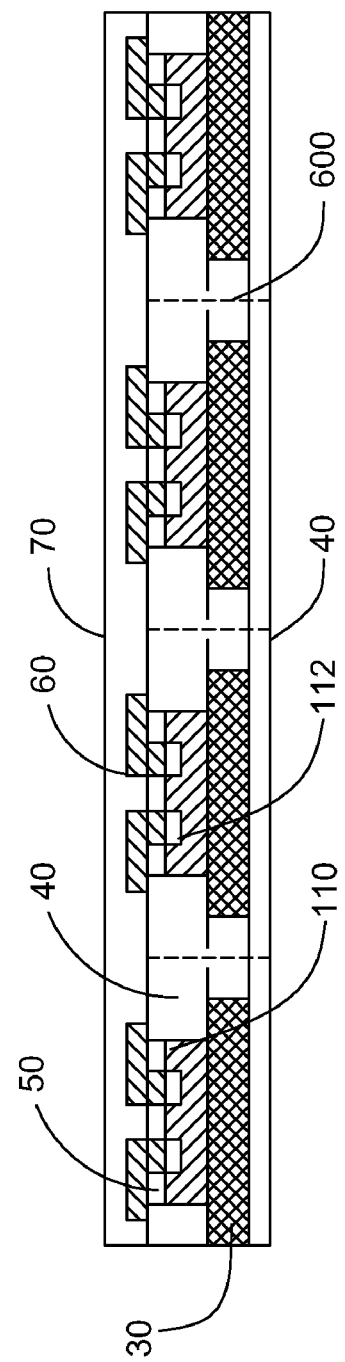

CHIP PACKAGE STRUCTURE AND THE METHOD THEREOF WITH ADHERING THE CHIPS TO A FRAME AND FORMING UBM LAYERS

The current application is a divisional application of, and claims a priority to the U.S. patent application Ser. No. 12/325,303 filed on Dec. 1, 2008 now U.S. Pat. No. 7,700,412, which claims a foreign priority to a patent application in Taiwan with serial number 097109826 filed on Mar. 20, 2008.

BACKGROUND OF THE INVENTION

1. Field of the Invention

The present invention is relates to die rearrangement package method, and more particularly is related to a package method by utilizing a chip-placed frame to relocate the chips.

2. Description of the Prior Art

The semiconductor technology is well developed and grown up very fast. Because the microlized semiconductor dice are required to include more functions, the semiconductor dice are necessary to have more input/output (I/O) pads. The density of the metal pins is higher day after day. Therefore, the previous lead package technology is not compatible for dice with high density of metal pins. A Ball Grid Array (BGA) package method is used for dices with high density of metal pins. The BGA package method is not only suitable for using in dices with high density of metal pins, but also the solder balls is not easy to be damaged and out of shape.

Because the 3C products, such as cell phone, personal digital assistant (PDA), or MP3 player, are more and more popular in the market, there are more and more complicated chips installed in a very tiny space. In order to solve the microlized problems, a wafer lever package (WLP) technology is developed. The WLP technology is able to package the dice before sawing them to be several chips. U.S. Pat. No. 5,323,051 discloses a WLP technology. However, when the pads on the active surface of the chips are increased and the interval between the pads is become smaller, the WLP technology will cause the signal overlapped or interrupted problems. So, when the chip is become further smaller, the previous package methods are not good enough to use.

In order to solve the problem described above, U.S. Pat. No. 7,196,408 discloses that a wafer is tested and sawed in semiconductor manufacture and put the good dice in another carrier board to do the package process. Therefore, the pads on the dice are able to be separated with good interval. For example a fan out technology is used, it is able to solve the small interval problem but it may cause the signal overlapped or signal interrupt problems.

Nevertheless, in order to let the semiconductor chips have smaller and thinner package structures, before sawing the dices, the wafer will do a thin process first, such as backside lapping process to thin the wafer in 2~20 mils, and the wafer is sawed to be several pieces of chips. After the thin process is done, the dices are put on another carrier board and a molding process is used to encapsulate the chip to be a package structure. Because the chip is very thin, the package structure is also very thin. Therefore, when the package structure is left from the carrier board, the package structure would be out of shape and it would cause the difficulty to do the sawing process.

After sawing the wafer, because the dice are put on another carrier board, the size of the new carrier board is larger than the original carrier board, the ball mounting process is hard for the solder ball to be installed at the exact location and the reliability of the package structure is reduced.

Besides, in the package procedure, the manufacture equipment will generate more pressure in the dice during the ball mounting process. Because of the material of the balls, the resistance between the balls and the solder pads will be become higher than usual and it would affect the function of the chips.

SUMMARY OF THE INVENTION

According to the problems described above, a multi-chips package structures and method is disclosed herein to relocate the chips and then do the package procedures.

Another object of the present invention is to provide the packaging method for dies rearrangement. The dies derived from a 12-inches wafer are rearranged on the substrate of an 8-inches wafer. The packaging equipments for the 8-inches wafer may be utilized to reduce the packaging cost.

Another object of the present invention is to provide the packaging method of dies rearrangement. All of dies packaged are known good ones to reduce the packaging and manufacturing costs.

According to abovementioned, the present invention provides a die package method which includes providing a wafer, and the wafer includes a top surface and a reverse surface and the wafer includes a plurality of chips and each the plurality of chips includes an active surface and there are a plurality of pads disposed on the active surface; forming a first protective layer on the top surface of the wafer and covering the plurality of pads; sawing the wafer to become the plurality of chips; providing a chip-placed frame, which includes a plurality of chip-placed areas, and a plurality of leads is used to connect each the plurality of chip-placed areas and there is a gap existed between each the plurality of chip-placed areas, and an adhesive layer is disposed on a top surface of each the plurality of chip-placed areas; pick and placing the plurality of chips on each the plurality of chip-placed areas and a reverse surface of each the plurality of chips is stuck on each the plurality of chip-placed areas by the adhesive layer; forming a polymer material on the chip-placed frame and the plurality of chips with the first protective layer thereon; placing a molding apparatus to planarize the polymer material to make the polymer material is filled between the plurality of chips and cover each the plurality of chips and the chip-placed frame; separating the molding apparatus to expose a top surface of the first protective layer on each the plurality of chips; removing the first protective layer to expose the plurality of pads of each the plurality of chips so as to the height of the polymer material is larger than each the plurality of chips; forming a patterned second protective layer to cover the exposed plurality of pads and portion of the polymer material; forming a plurality of fan-out and patterned metal traces, and each the plurality of patterned metal traces is electrically connected to the plurality of pads on the active surface of each the plurality of chips, and each the plurality of patterned meta traces includes a fan-out structure, which is extended out of the active surface of each the plurality of chips; forming a patterned third protective layer to cover the patterned metal trace and expose a portion of the fan-out structure, which is extended out of the active surface of each the plurality of chips; forming a plurality of patterned UBM layers to cover a portion of the fan-out structure, which is extended out of the active surface of the chips, and the patterned UBM layer is electrically connected to the plurality of patterned metal traces; forming a plurality of conductive elements, and the conductive elements are electrically connected to patterned metal traces by the patterned UBM layer; and sawing the package structure and the leads of the chip-placed frame to form a plurality of stand alone and packaged chips.

According to abovementioned, the present invention also provides a die package structure which includes a chip-placed frame, which includes a plurality of chip-placed areas, and a plurality of leads is used to connect each the plurality of chip-placed areas and there is a gap existed between each the plurality of chip-placed areas, and a top surface of the plurality of chip-placed area include an adhesive layer; a chip including an active surface and a reverse surface and the active surface and a reverse surface, and the active surface includes a plurality of pads and the reverse surface is formed on the adhesive layer of said chip-placed areas; a package structure surrounding the chip-placed frame and the plurality of chips and the plurality of pads on the active surface are exposed; a plurality of patterned metal traces, and one end of the patterned trace is electrically connected to the plurality of pads and one another end of the patterned metal trace is extended and covered a surface of the patterned first protective layer; a plurality of patterned protective layers used to cover the plurality of patterned metal traces and expose a portion of a surface of a fan-out structure of the plurality of patterned metal traces, which is extended out of the active surface; a plurality of patterned UBM layers formed on the fan-out structure and electrically connected to the patterned metal traces; and a plurality of conductive elements formed on the portion surface of the plurality of patterned UBM layers and electrically connected to the plurality of patterned metal traces.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a view illustrating that a plurality of chips disposed on a wafer according to an embodiment of the present invention;

FIG. 2 is a view illustrating that a first protective layer formed on the wafer according to an embodiment of the present invention;

FIG. 5 is a sectional view illustrating that the chip-placed frame including a plurality of chips in AA segment of FIG. 4A or FIG. 4B;

FIG. 6 is a sectional view illustrating that a polymer material formed on the dies an embodiment of the present invention;

FIG. 7 is a sectional view illustrating that a polymer material is flatted an embodiment of the present invention;

FIG. 8 is a view illustrating that the first protective layer is removed to expose the active surface of each of the chips according to an embodiment of the present invention;

FIG. 11 is a view illustrating that a metal layer is formed on the each pads of each dies according to an embodiment of the present invention;

FIG. 12 is a view illustrating that a plurality of metal traces according to an embodiment of the present invention;

FIG. 13 is a view illustrating that a third protective layer is formed to cover the plurality of metal traces according to an embodiment of the present invention;

DESCRIPTION OF THE PREFERRED EMBODIMENT

In the present semiconductor package procedure, the wafer had passed in the front end process needs to do a thinning process first, such as the thickness of the wafer is thinned to 2~20 mil thick. Then, a sawing process is used to cut the wafer to be several pieces of dice 110 and a means for pick and place is used to put those dice 110 to another carrier board. Obviously, because the interval between the dice on the carrier board is larger than the size of dies, those relocated die is able to have larger interval. Therefore, the pads on the dies are able to be appropriately distributed.

Figure 3A:
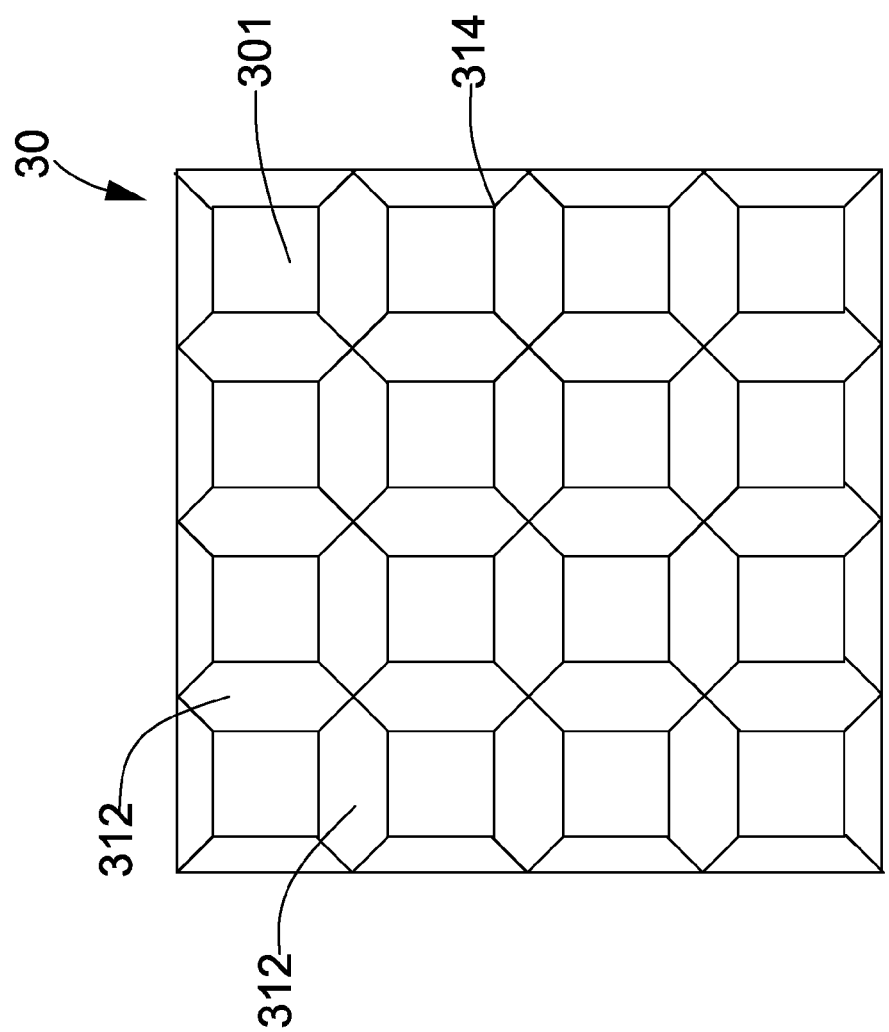
FIG. 3A and FIG. 3B are views illustrating that a chip-placed frame according to an embodiment of the present invention.
Figure 3B:
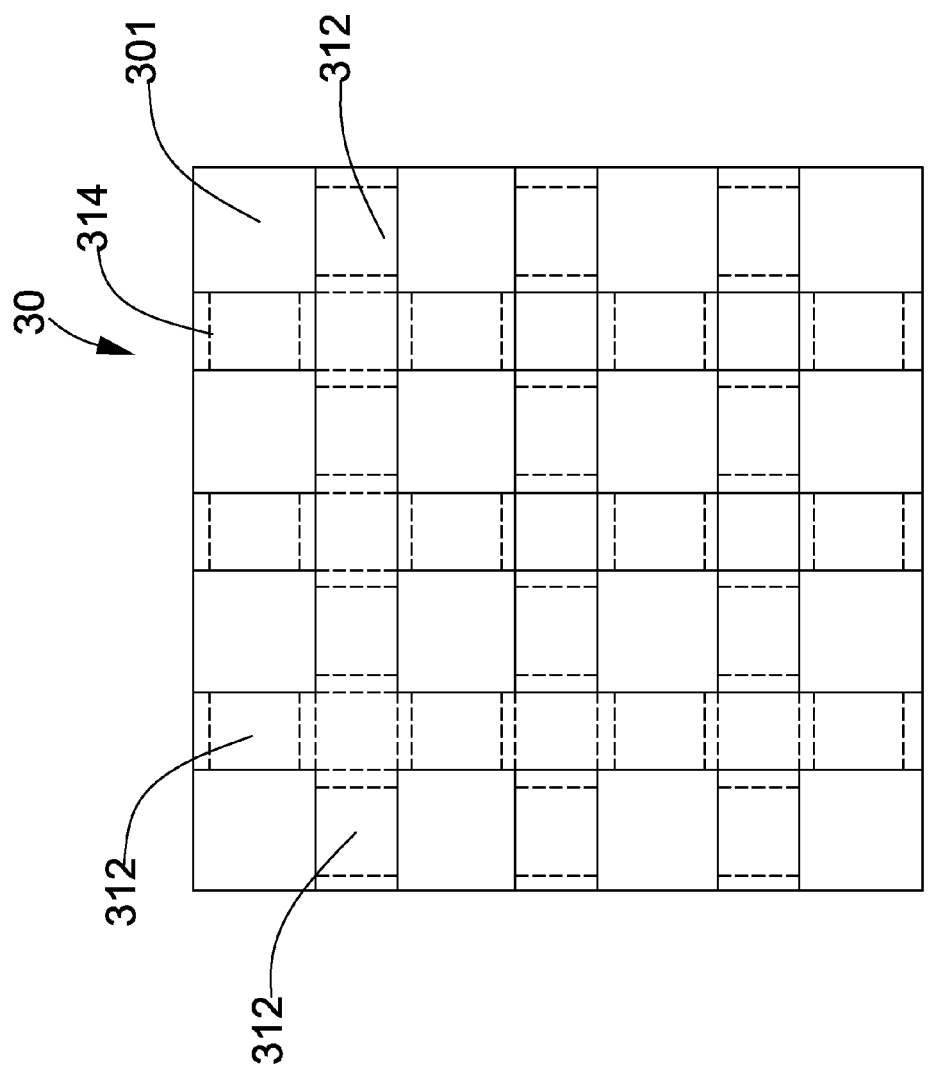

First, FIG. 1 is a top view showing that there is a plurality of dies 110 in a wafer 10 and each of the dies 110 includes a plurality of pads (not shown). FIG. 2 is view showing that a protective layer is formed on the wafer. As shown in FIG. 2, a first protective layer 20 such as photoresist layer is formed on the active surface of each plurality of dies 110 in the wafer 10. Next, FIG. 3A and FIG. 3B are views showing a chip-placed frame is used to relocate those chips. The chip-placed frame 30 is a reticulated frame and includes a plurality of chip-placed areas 301 with the same size. A plurality of leads 314 are used to connect each of the chip-placed areas 301. The connective way is to connect the four corners of the chip-placed area 301 and the four corners of the other chip-placed area 301 by the leads 314. Therefore, the adjacent chip-placed areas 301 are able to connect to each other and there is a gap between the adjacent chip-placed areas 301, as the rectangular gap 312 shown in FIG. 3A or FIG. 3B. The shape of the rectangular gap 212 can be like a diamond or a square and it is not limited in the embodiments of the present invention.

Figure 4A:
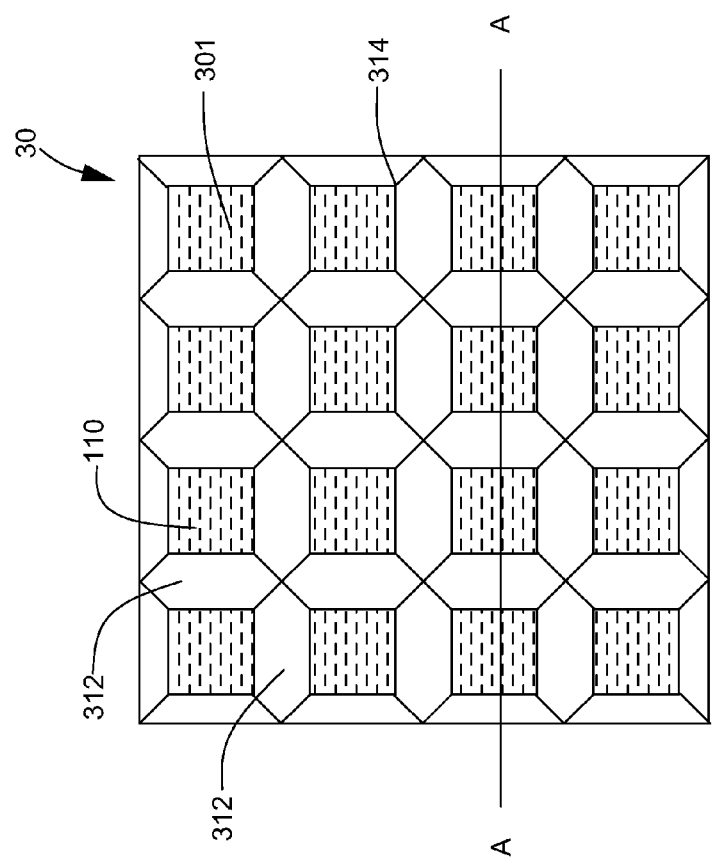
FIG. 4A and FIG. 4B are views illustrating that the wafer is sawed to form a plurality of chips and the chips are relocated on the chip-placed frame according to an embodiment of the present invention.
Figure 4B:
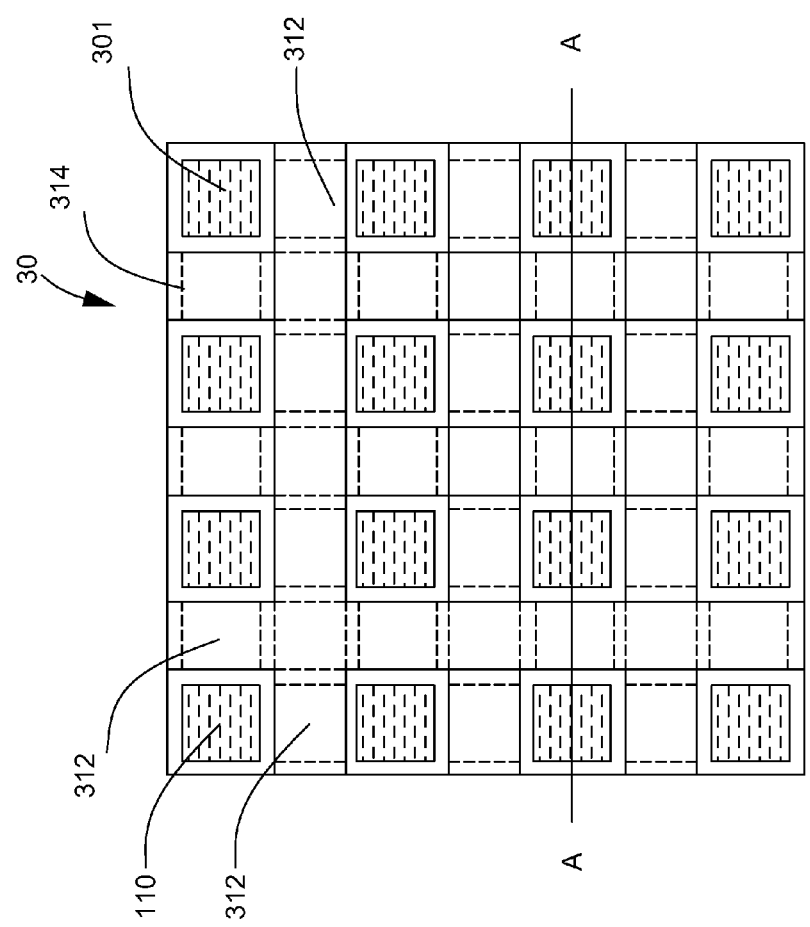

FIG. 4A and FIG. 4B are views showing that a plurality of chips is placed on the chip-placed area of the chip-placed frame. As shown in FIG. 4A and FIG. 4B, a first protective layer 20 is formed on the active surface of the wafer 10. Then, the wafer 10 with the first protective layer 20 thereon is cut into a plurality of dies 110 and the active surface of each of the dies 110 is faced up. Then, a pick and placing apparatus (not shown) is used to take up each dies 110 and put it on the chip-placed area 301 of the chip-placed frame 30. Because there are a plurality of pads 112 disposed on the active surface of each of the dies 110 and the pick and placing apparatus can recognize the location of the pads 112 on the active surface of the each dies 110. When the pick and placing apparatus is going to put the dies 110 on the chip-placed area 301 of the chip-placed frame 30, the die 110 is able to exactly put on the chip-placed area 301 of the chip-placed frame 30 in accordance with the reference point (not shown) of the chip-placed area 301 and the relative location of the chip-placed frame 30. Therefore, when the dies 110 are relocated on the chip-placed frame 30, the dies 110 are able to put on the current location of the chip-placed frame 30. Besides, the relative location of the chip-placed area 301 is used to enhance the accuracy of the relation of the dies 110 by using the chip-placed area 301 to relocate those dies 110. As shown in FIG. 5, it is a view according to the AA line segment in FIG. 4A and FIG. 4B and showing that the reverse surface of the dies 110 is put on the chip-placed area 301 of the chip-placed frame 30.

Besides, in the present embodiment, the chip-placed frame 30 further includes an adhesive layer (not shown) and the adhesive layer is used to stick the reverse surface of the dies 110 on the chip-placed area 301 when the die 110 is put on the chip-placed areas 301 of the chip-placed frame 30. The material of the adhesive layer is a sticky material with elasticity and is selected form the group consisting of: silicone rubber, silicone resin, elasticity PU, multi-holes PU, acrylic rubber and chip cutting glue.

Now referring to FIG. 6, a polymer material 40 is injected into the chip-placed frame 30 and the active surface of the dies 110. The polymer material 40 is flowed into the surrounding of the chip-placed areas 301 of the chip-placed frame 30 by passing the gaps of the chip-placed frame 30. The polymer material 40 encapsulates the chip-placed frame 30 and every dies 110 and is filled between the dies 110 to form a package structure. In this embodiment, the material of polymer material 40 is selected from the group consisting of: silicon rubber, epoxy, acrylic, BCB, and so on.

The flat polymer material 40 is able to perform a baking process to solid the polymer material. And then, a mold-release process is used to separate the mold apparatus 500 and the polymer material 40 and expose the surface of the polymer material 40, as shown in FIG. 7. Next, a sawing knife is optionally utilized to saw the surface of the polymer material 40 to be a plurality of sawing lines 600. The depth of each of the sawing lines 600 is about 0.5~1 mils. The width of each of the sawing lines 600 is about 5~25 mm In a preferred embodiment, the sawing lines 600 are interlaced to each other and used to be the reference line when sawing the dies.

Now please referring to FIG. 8, a semiconductor process, such as lithography and etching, is used to form a patterned photoresist layer (not shown) on the polymer material 40. Next, an etching process is used to remove a portion of the first protective layer 20 to expose the active surface of each dies 110. Therefore, the height of polymer material 40 surrounding the each dies 110 is larger than the height of the dies 110.

Figure 9:
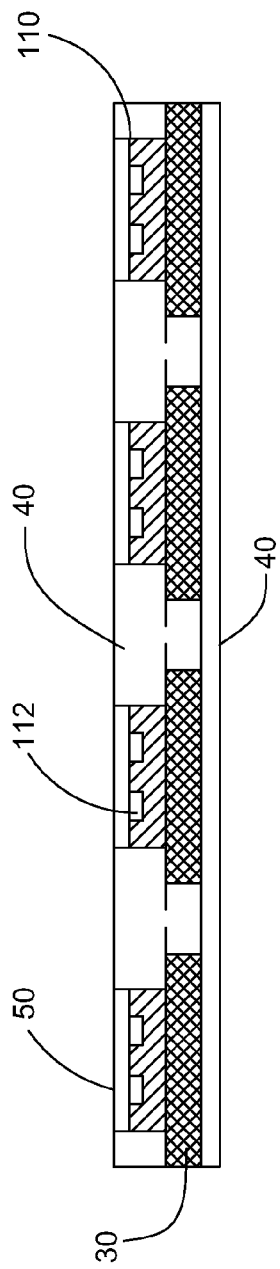
FIG. 9 is a view illustrating that a second protective layer is formed to cover the active surface of each dies and the portion of polymer material according to an embodiment of the present invention.
Figure 10:
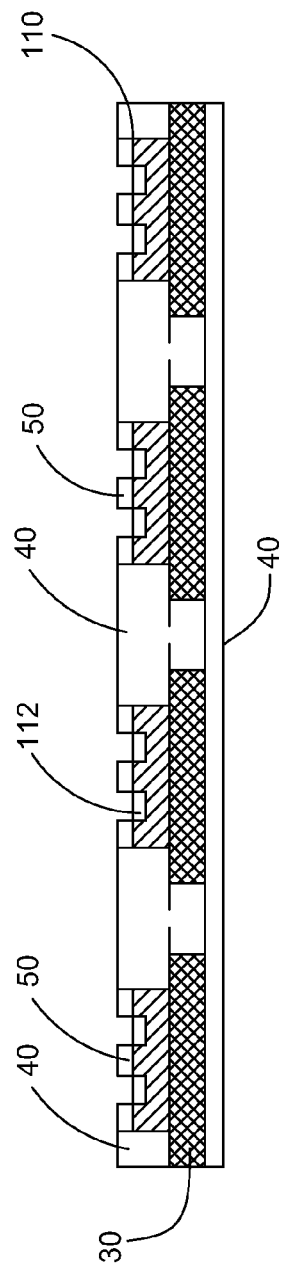
FIG. 10 is a view illustrating that a plurality of opening formed in the second protective layer to expose each pads of each dies according to an embodiment of the present invention.
Figure 14:
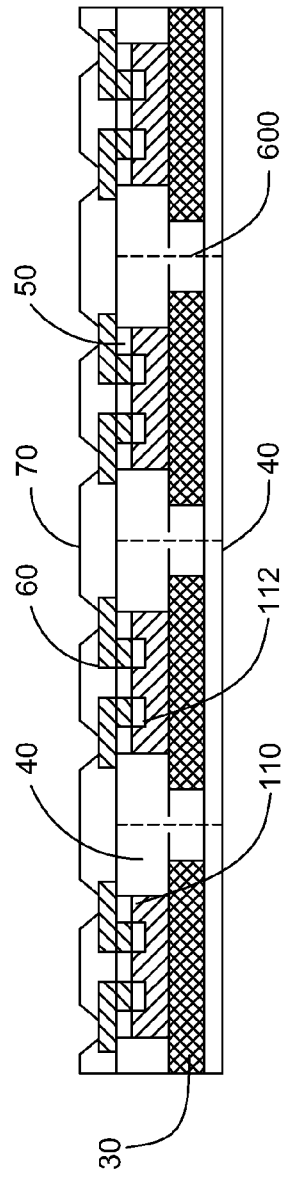
FIG. 14 is a view illustrating that a plurality of openings exposed the extended surface of the plurality of metal traces according to an embodiment of the present invention.

And then please referring to FIG. 9, a patterned second protective layer 50 is formed on the active surface of each dies 110 and the portion surface of the polymer material 40, and the plurality of pads is exposed. The forming steps include: a patterned photoresist layer (not shown) is formed on the second protective layer 50; an etching process is used to remove a portion of second protective layer 50 and a plurality of openings (not shown) is formed therein to expose a plurality of pads 112 on the active surface of each dies 110, as shown in FIG. 10.

Then, FIG. 11 and FIG. 12 are views showing the fan-out and patterned metal traces is formed on the package structure. After the location of the pads 112 for each of the dies 110 is confirmed, the conventional redistribution layer (RDL) process is used on the pads 112 exposed on each of the dies 110 to form a plurality of fan-out and patterned metal traces 60. One end of ach of the patterned metal traces 60 is electrically connected to the pads 112 and some other ends of a portion of the patterned metal traces 70 are formed on the polymer material 40 by a fan-out format. The steps to form the patterned metal traces 60 include: forming a metal layer (not shown) on the patterned second protective layer 60 and the metal layer 60 is filled into the exposed pads 112; forming a patterned photoresist payer (not shown) on the metal layer 60; etching a portion of the metal layer 60 to form the patterned metal traces 60 as shown in FIG. 12. In this embodiment, one end of each of some patterned metal traces 60 is electrically connected to the pads 112 on the active surface of the dies 110 and other end of each of some patterned metal traces 60 is formed on the polymer material 40.

Now referring to FIG. 13, a third patterned protective layer 70 is formed on the fan-out and patterned metal traces 60 and used to cover the active surface of each of the dies 110 and the fan-out and patterned metal traces 60 by a semiconductor manufacture, as shown in FIG. 13. Then, the same semiconductor manufacture is used to form a plurality of openings (not shown) on the second protective layer 50 and the externally extended surface of the active surface of each of the dies 110, which is opposite to the patterned metal traces 60. The steps of forming the openings on the second protective layer 50 include: forming a patterned photoresist layer (not shown) above the second protective layer by a semiconductor manufacture, such as photo-lithography or etching; then etching to remove a portion of the second protective layer 50 to form a patterned second protective layer 50; exposing a surface of the other end of the fan-out and patterned metal trace 60.

Figure 15:
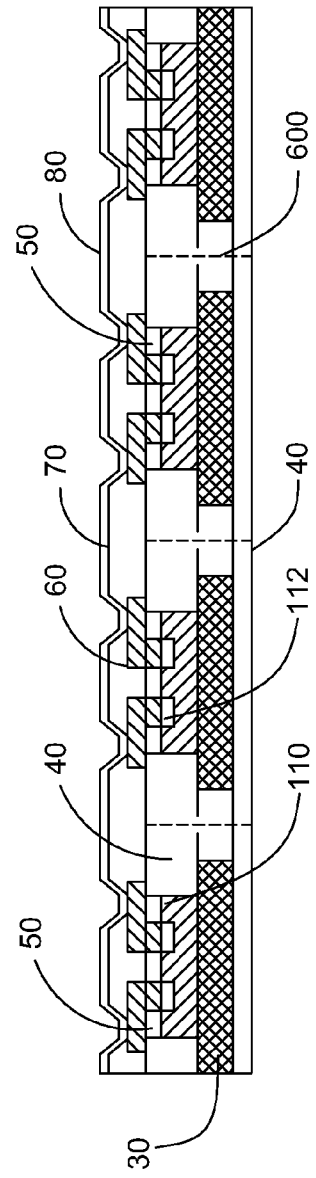
FIG. 15 is a view illustrating that an UBM layer is formed after exposing a plurality of patterned metal traces a plurality of pads according to an embodiment of the present invention.
Figure 16:
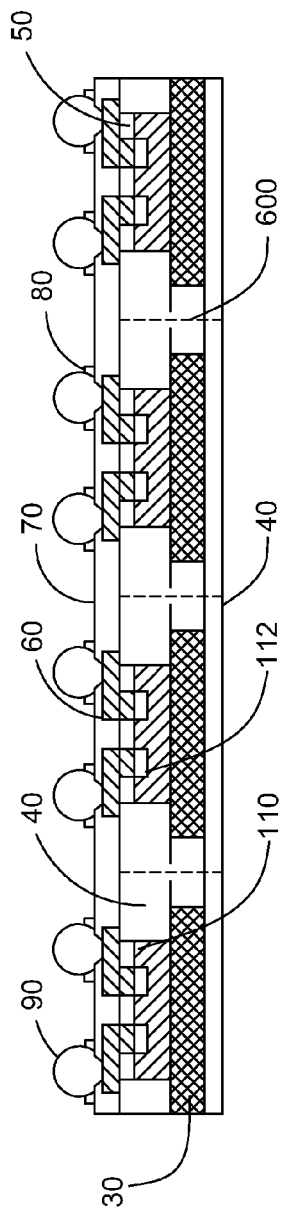
FIG. 16 is a view illustrating that a conductive element is formed on surface of each of the patterned UBM layer according to an embodiment of the present invention.

Now, in FIG. 15, it is a view showing that a plurality of patterned UBM layers are formed on the surface of the other end of the exposed, fan-out and patterned metal trace. As shown in FIG. 15, on the surface of the other end of the exposed, fan-out and patterned metal trace, a UBM layer (not shown) is formed by the way of sputtering. Next, by a semiconductor manufacture (such as photo-lithography or etching), a patterned photoresist layer (not shown) is formed on the UBM layer. Then, a portion of the UBM layer is removed by an etching method to form a plurality of patterned UBM layers 80 on the surface of the exposed each of the fan-out patterned metal traces 60. The patterned UBM layers 80 are electrically connected to the patterned metal traces 60, in the present embodiment, the material of the UBM layer 80 is Ti/Ni. And then, a photo-lithography or etching method is used to remove a portion of the UBM layers 80 and keep some metal traces 60, which are electrically connected to the UBM layer 80.

Figure 17:
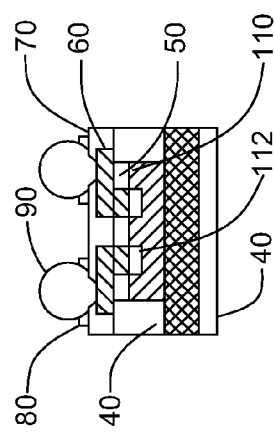
FIG. 17 is a view illustrating that a package structure of a single chip according to an embodiment of the present invention.

Eventually, a plurality of conductive elements 90 are formed on each of the UBM layers 80 and used to be the connective points for the dies 110 to connect the external components. The conductive elements 90 can be some metal bumps or solder balls and are electrically connected by the patterned UBM layers 80 and the patterned metal traces 60. Therefore, the package structure is able to perform the final cutting. In the present embodiment, the cutting unit can be a plurality of dies 110 and formed a multi-die package structure, as shown in FIG. 17.

It should be noted that the fan-out structure of the metal trace 60 is not limited by using a conventional RDL and as long as the semiconductor manufacture method can form a fan-out structure can be one of the embodiments in the present invention. Basically, the semiconductor manufacture method to form a fan-out structure is a conventional prior art, the detail description is omitted herein.

In the embodiments described above, the flat polymer material 40 is formed by molding process. Moreover, a molding apparatus 500 is sued to cover over the chip-placed frame 30 and keep a space between the molding apparatus 500 and the dies 110, and then a molding process is used to put the polymer material 40, such as Epoxy molding compound (EMC), in the space between the molding apparatus 500 and the dies 110. Therefore, the polymer material 40 is formed a flat surface. The polymer material 40 is able to cover each of the dies 110 and filled in the gaps between the dies 110, and covered the chip-placed frame 30. Because the steps after the process are described in the previous sections, the detail description is omitted herein.

What is claimed is:

1. A die package structure, comprising:
   a chip-placed frame, including a plurality of chip-placed areas and a plurality of leads, wherein said plurality of leads is used to connect each said plurality of chip-placed areas and there is a gap existing between each said plurality of chip-placed areas, and each said plurality of chip-placed areas includes an adhesive layer on a top surface thereof;
   a chip including an active surface and a reverse surface, wherein said active surface includes a plurality of pads and said reverse surface is formed on said adhesive layer of each said chip-placed areas;
   a package structure surrounding said chip-placed frame and said plurality of chip, wherein said plurality of pads on said active surface are exposed;
   a plurality of patterned metal traces, wherein one end of said patterned metal trace is electrically connected to said plurality of pads and the other end of said patterned metal trace is extended and covered a surface of said package structure;
   a plurality of patterned protective layers used to cover said plurality of patterned metal traces and expose a portion of a fan-out structure of said plurality of patterned metal traces which is extended away from said active surface;
   a plurality of patterned UBM layers formed on said fan-out structure and electrically connected to said patterned metal traces; and
   a plurality of conductive elements formed on said plurality of patterned UBM layers and electrically connected to said plurality of patterned metal traces.

2. The package structure according to claim 1, wherein the material of said package structure is polyimide.

3. The package structure according to claim 1, wherein the material of said UBM layer is Ti/Ni.

4. The package structure according to claim 1, wherein said conductive elements is solder ball.

5. The package structure according to claim 1, wherein said conductive element is metal bump.

* * * * *